(12) United States Patent
Zecri

(10) Patent No.: US 7,955,973 B2
(45) Date of Patent: Jun. 7, 2011

(54) METHOD AND APPARATUS FOR IMPROVEMENTS IN CHIP MANUFACTURE AND DESIGN

(75) Inventor: Michel Zecri, Barraux (FR)

(73) Assignee: Freescale Semiconductor, Inc., Austin, TX (US)

( * ) Notice: Subject to any disclaimer, the term of this patent is extended or adjusted under 35 U.S.C. 154(b) by 235 days.

(21) Appl. No.: 12/375,854

(22) PCT Filed: Aug. 1, 2006

(86) PCT No.: PCT/IB2006/054088
§ 371 (c)(1),
(2), (4) Date: Jan. 30, 2009

(87) PCT Pub. No.: WO2008/015500
PCT Pub. Date: Feb. 7, 2008

(65) Prior Publication Data
US 2010/0019395 A1  Jan. 28, 2010

(51) Int. Cl.
*H01L 21/44* (2006.01)
*H01L 23/42* (2006.01)
(52) U.S. Cl. ........ 438/666; 438/612; 438/618; 438/622; 257/758; 257/773; 257/786; 257/E23.02
(58) Field of Classification Search .................. 438/666, 438/612, 618, 622; 257/758, 773, 786, E23.02
See application file for complete search history.

(56) References Cited

U.S. PATENT DOCUMENTS

| | | | | |
|---|---|---|---|---|
| 5,248,903 A * | 9/1993 | Heim | .................. | 257/748 |
| 5,502,337 A * | 3/1996 | Nozaki | .................. | 257/773 |
| 5,986,343 A * | 11/1999 | Chittipeddi et al. | .................. | 257/758 |
| 6,034,439 A * | 3/2000 | Teng et al. | .................. | 257/786 |
| 6,287,950 B1 * | 9/2001 | Wu et al. | .................. | 438/612 |
| 6,444,295 B1 * | 9/2002 | Peng et al. | .................. | 428/209 |
| 6,476,491 B2 * | 11/2002 | Harada et al. | .................. | 257/758 |
| 6,531,384 B1 | 3/2003 | Kobayashi et al. | | |
| 6,563,226 B2 | 5/2003 | Harun et al. | | |
| 6,717,270 B1 | 4/2004 | Downey et al. | | |
| 6,897,570 B2 * | 5/2005 | Nakajima et al. | .................. | 257/786 |
| 7,741,716 B1 * | 6/2010 | Venkitachalam et al. | .................. | 257/758 |
| 2001/0051426 A1 | 12/2001 | Pozder et al. | | |
| 2002/0079552 A1 * | 6/2002 | Koike | .................. | 257/529 |
| 2004/0159951 A1 | 8/2004 | Toyoda et al. | | |
| 2005/0121803 A1 | 6/2005 | Angell et al. | | |
| 2006/0065969 A1 * | 3/2006 | Antol et al. | .................. | 257/700 |

OTHER PUBLICATIONS

International Search Report and Written Opinion correlating to PCT/IB06/054088, dated Apr. 24, 2007.

* cited by examiner

*Primary Examiner* — Nitin Parekh

(57) ABSTRACT

A method of securing a bond pad in to a semiconductor chip having an upper top metal surface which includes one or more holes, the method comprising the steps of forming a passivation layer over the upper metal surface, which passivation layer has holes therein substantially corresponding to the or each hole in the upper metal layer and being substantially the same size or smaller than the holes in the upper metal layer; forming the bond pad over the passivation layer; characterised in that the step of forming the bond pad comprises introducing some of the material from the bond pad into the holes in the passivation layer and upper metal layer when forming the bond pad, securing the bond pad to the passivation layer by allowing said material to flow under the surface thereof and attach thereto without attaching to the upper metal layer to thereby form a securing means.

18 Claims, 4 Drawing Sheets

METHOD AND APPARATUS FOR IMPROVEMENTS IN CHIP MANUFACTURE AND DESIGN

FIELD OF THE INVENTION

This invention relates to a method and apparatus for improving chip manufacture and design, particularly but not exclusively in respect of increased robustness and anchoring for bond pad or bumps in metal layers.

BACKGROUND OF THE INVENTION

The technology of chips continues to change and generally this means a further reduction in size. Each reduction in size presents more problems which must be overcome. In particular for smaller devices one of the main issues which arise is the strength or robustness of the chips. This is the case in all parts of the chip but can be more of an issue in the areas where probing or other types of testing are carried out.

The problems of spreading the forces of testing have been discussed in a number of documents with respect to the domain of micro technology (i.e. size $\sim 10^{-6}$ m). For example U.S. Pat. No. 6,563,226 B2 (Motorola) and U.S. Pat. No. 6,717,270 (Motorola) describe the use of probe-over-passivation (POP); bond-over-passivation (BOP) and bond over activated layer (BOA) processes.

US 200005/0121803 A1 relates to an internally reinforced bond pad. The reinforced bond pad has a non planar dielectric structure and a metallic bond layer which conforms with this non-planar dielectric structure. This invention requires a dual inlaid bonding surface (which needs a very complex process with many steps). U.S. Pat. No. 6,531,384 B1 discloses a so called "armoured" bond pad. This patent teaches a structure having a number of islands of copper metal 18 extending above the insulation 14. In addition this patent deals with bonding and probing in the same area. The metal dielectric pattern is an uppermost metal e.g. aluminium and would not be compatible with fine-pitch bond pads. This also limits bond over activation (BOA) compatibility because the bonding surface must be electrically connected by underlying metal layers. The alternation of copper islands and passivation provides vertical connectivity. To make this alternation of copper islands and passivation layer requires a number of additional steps of processing which add to the cost and time for making the device.

SUMMARY OF THE INVENTION

The present invention provides a method and apparatus as described in the accompanying claims.

DETAILED DESCRIPTION OF THE PREFERRED EMBODIMENTS

Figure 1:
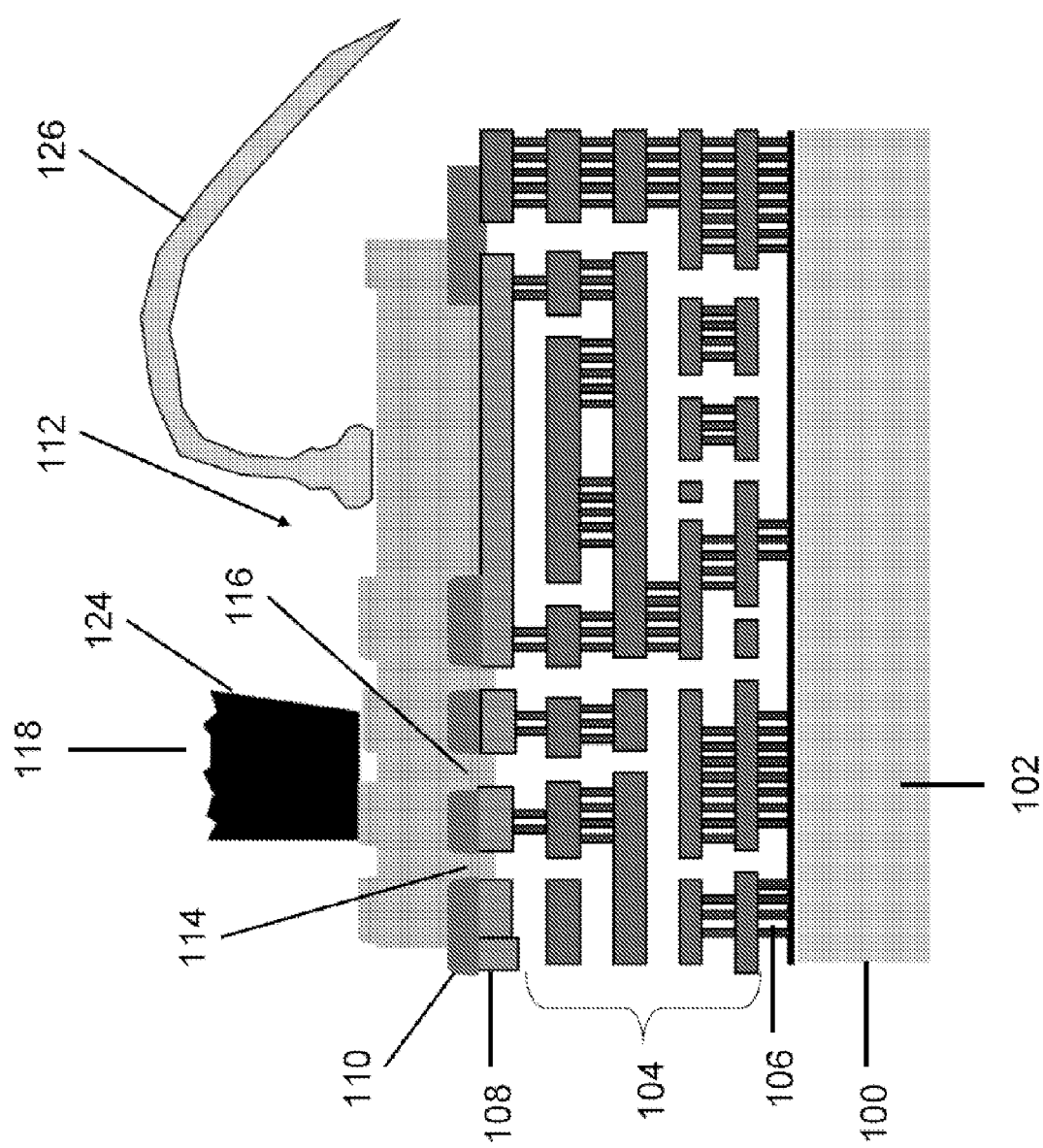
FIG. 1 is a cross-sectional diagram of the first embodiment of a chip, in accordance with one embodiment of the present invention.

Referring to FIG. 1, a nanometre technology active device is shown 100. The device could be produced on a silicon base and be something such as a MOSFET, a diode, etc. The silicon layer is shown as 102. The device is made up of a plurality of layers of metal and insulator 104, formed with vias and other connections 106 there-between as appropriate. The nature and design of the layers would be dependant on the specific nature of the device. The layers of metal would typically be of copper or any other appropriate metal and the layers of insulator would be of any dielectric material as is appropriate to the process and device required. The uppermost metal layer 108 is formed in accordance with the final design of the chip. Then a passivation layer 110 is applied over the surface of the chip and patterned as appropriate to allow bonding to occur in a wire bond region 112. The patterning of the passivation layer is similar to that of the upper metal layer 108, in order that there are holes therein which substantially correspond with any holes in the metal layer. The reason for these holes will be described in greater detail below. Two such holes are labelled as 114 and 116 in the region of the probe area 118. A bond pad layer (aluminium layer) 120 is applied and, in the surface of the probe area or probe region 118, a number of passivation vias 122 are patterned. The bond pad layer 120 could be of copper, aluminium or any other appropriate material and may not cover the complete surface of the device, being instead at various areas or regions. The function of the passivation vias 122 are described in greater detail in our co-pending application SC14021CF filed on common date herewith and incorporated herein by reference.

The probe 124 makes contact with the probing region and a force is applied. Due to the fact that the vias exist underneath the probe, not all the stress of the probing is concentrated on one particular point; in fact the maximum stress of the probe is spread over all the areas around the vias. The patterned vias on the probe over passivation space effectively distribute the stress of probing. After the probing process has been carried out and the chip has passed the necessary test, the wire bond 126 may then be attached to the wire bond region 112.

The vias may patterned over both the probe and wire bond regions. This can be useful if any tests are carried out over the wire bond region or bump region (region for bumping). Also the pattering is the same for the whole of layer 120 which means a less complex fabrication process may be adopted.

The passivation vias can be shaped in any manner, for example, squares honeycomb, circular etc. The shape and size of the holes are configured in such a way that the hole is smaller than the probe tip and so that the tip cannot catch on the edge of the hole. The holes may have for example chamfered or similar edges. In addition, if the general design requirements set out above are met for different shapes of hole, there is no limit to the shape, orientation, number etc of the vias.

Figure 2:
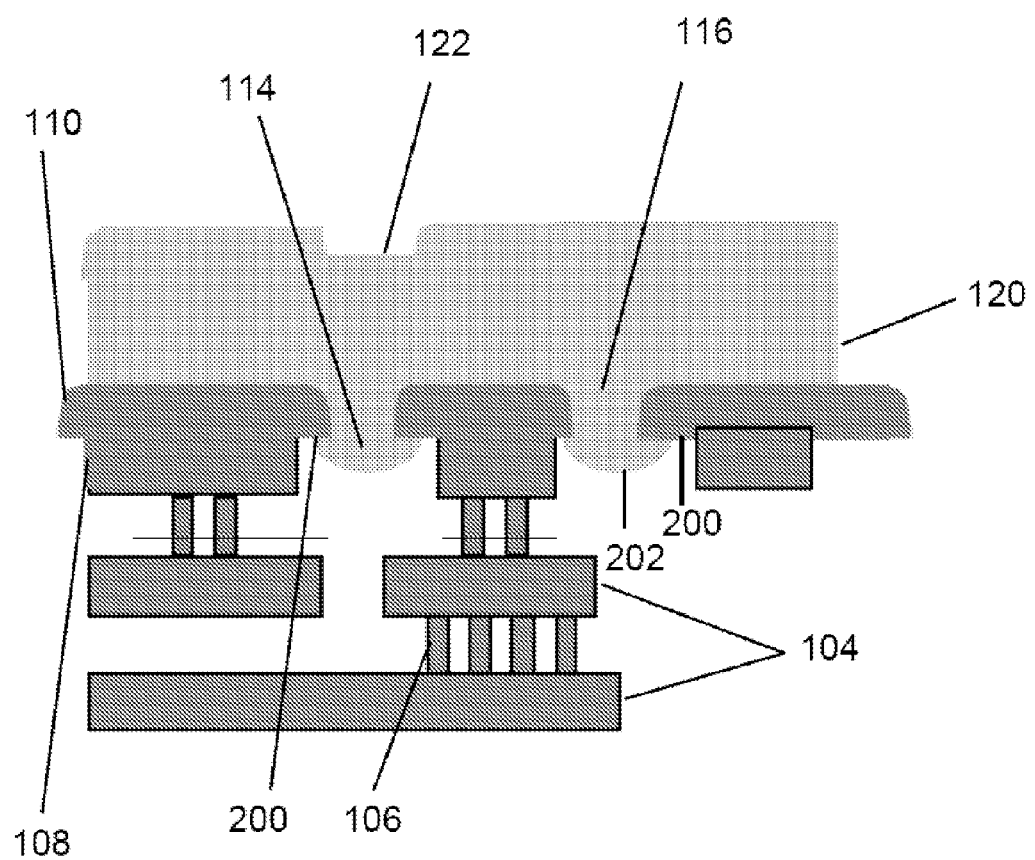
FIG. 2 is a detailed section of the layers in the region of the passivation layer shown in FIG. 1, in accordance with one embodiment of the present invention.

Referring now to FIG. 2 a more detailed drawing of the region of the passivation layer is shown. The area shown includes the uppermost layer of the chip 108 with the passivation layer 110 thereon. The holes in the passivation layer 114 and 116 are also shown in more detail. The passivation layer 110 slightly overlies the metal layer 108 to provide an overhanging region 200. When the bond pad layer 120 is applied some of the metal seeps into the holes and extends along some of the length of the overhanging region to give rise to an anchor 202. The anchor effectively "hooks" around the edges of the hole forming an attachment thereto as the metal solidifies. It will be appreciated that the anchor or anchor point can be formed in any other appropriate way and the invention is not limited to them being formed by the flow of molten metal and the solidification thereof.

Figure 3:
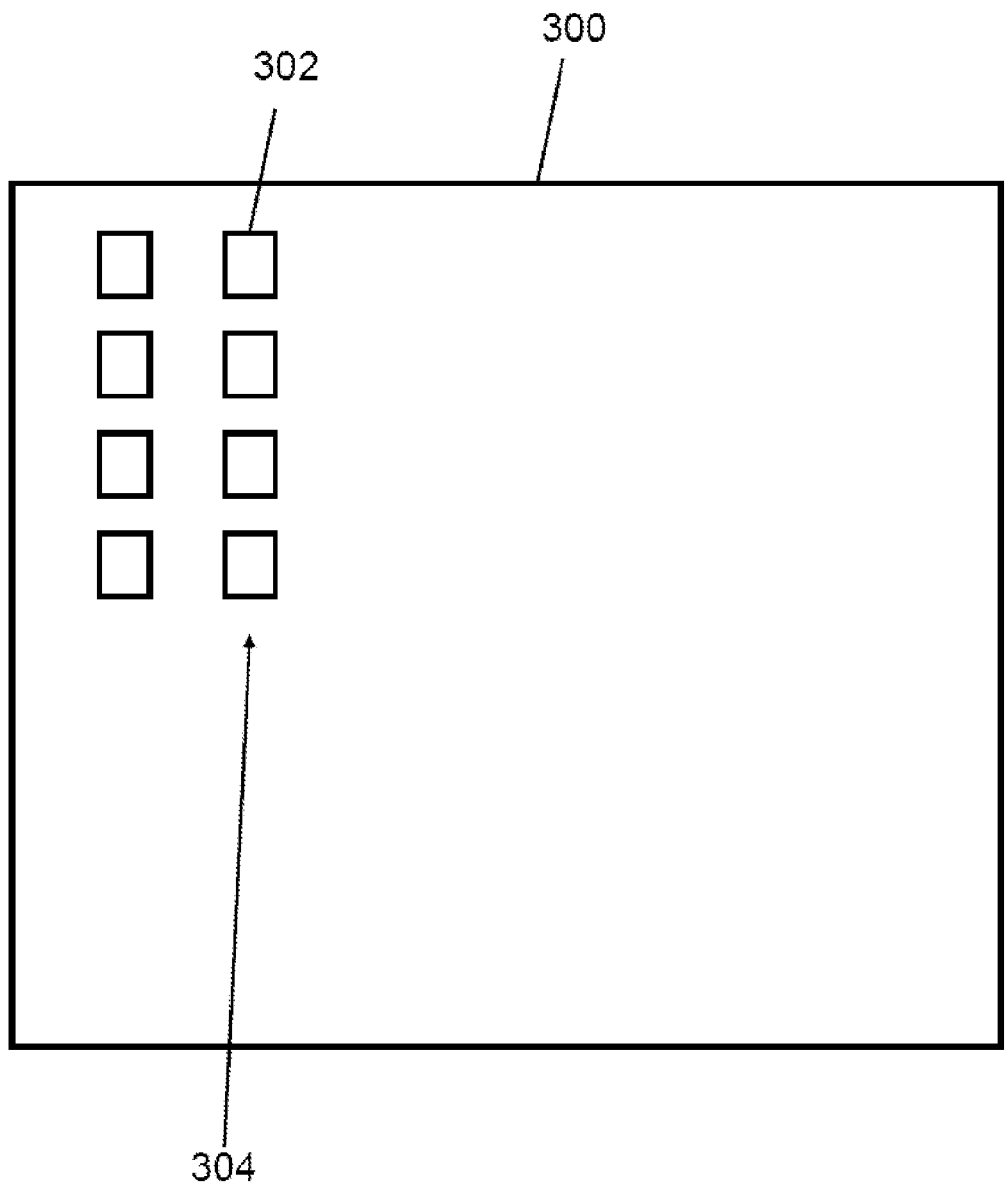
FIG. 3 is a diagram showing a plan view of the passivation layer in accordance with one embodiment of the present invention.

The uppermost metal layer of the chip 300 is shown from above in FIG. 3. The top surface includes a plurality of holes 302 in the form of a grid shown generally at 304. In the figure the grid does not extent over the whole surface of the top metal layer, but it could if circumstances dictated this requirement. In addition the layer may be a number of regions instead of a layer. The holes are shown as square holes, but this again does not need to be the case. The holes can be any shape and size. On application of the passivation layer the grid format of the top metal layer is preserved such that the holes are still evident from above. The holes will be slightly smaller due to the existence of the overhanging region that is formed by the passivation layer. Thus when the bond pad is applied the molten metal enters each of the holes 302 and forms an anchor therein.

The term anchor is used as the term for the metal plug which is formed in the hole and which extends into the region of the overhanging region. However, it will be appreciated that the anchor may take many different shapes and forms. The term anchor includes any other type of fastening, securing or connecting means which has the same function, i.e. that of adding an additional element of attachment of the bond pad layer to the passivation layer.

The size of the overhang region must be carefully determined so that the metal of the anchor does not make contact with the uppermost metal layer 108 and cause short circuits and the like. The determination may depend on the types of metal used; the flowability of the metal; the size of the hole and the overhangs; the nature of the materials of all the layers and/or other details of the chip design and size. The minimum distance between the anchor and the metal layer 108 depends on the design rules applied for the considered technology to avoid any electrical problems in the final chip.

The aluminium layer 120 is one example of a layer on the chip where bonding or probing might occur. There may be other types of layer in other circumstances where the anchor points are also applicable and useful. For example, layers of different metals at different places on the chip. All that is required is that there is an upper layer or regions over the passivation layer which have been formed to give rise the anchor point described above.

The addition of the anchor point provides improved bond pad reliability for the bond pad layer. This can be demonstrated in for example peeling tests. The results of such peeling tests give rise to 100% success rate for chips tested, that are formed with an anchor in accordance with an embodiment of the present invention.

Due to the anchor and the manner in which this is formed the last metal layer under the POP or bond pad is free to be used for routing which opens up more functionality for a device in accordance with an embodiment of the present invention. In addition, the mechanical capabilities of the bond pad are considerably augmented as compared with the same type of chip without the benefits of an embodiment of the present invention. Additionally the bond pad of an embodiment of the present invention offers a reduced risk of cracking during probing and bond application, which thus enables use of a larger process window.

As previously indicated there are a number of passivation vias 122 which may be included in the upper surface of the bond pad layer 120. These vias increase the stresses that the surface of the device can sustain when a probing test is carried out as described in our co-pending application SC14021CF. As can been seen in FIG. 2 the vias 122 and the holes 114 and 116 may be aligned. In other words the passivation vias are located above or partially above the holes. If this is the case there is a still greater strength and robustness in the chip particularly during any probing or bonding operations or in general for any assembly and test operations.

Figure 4:
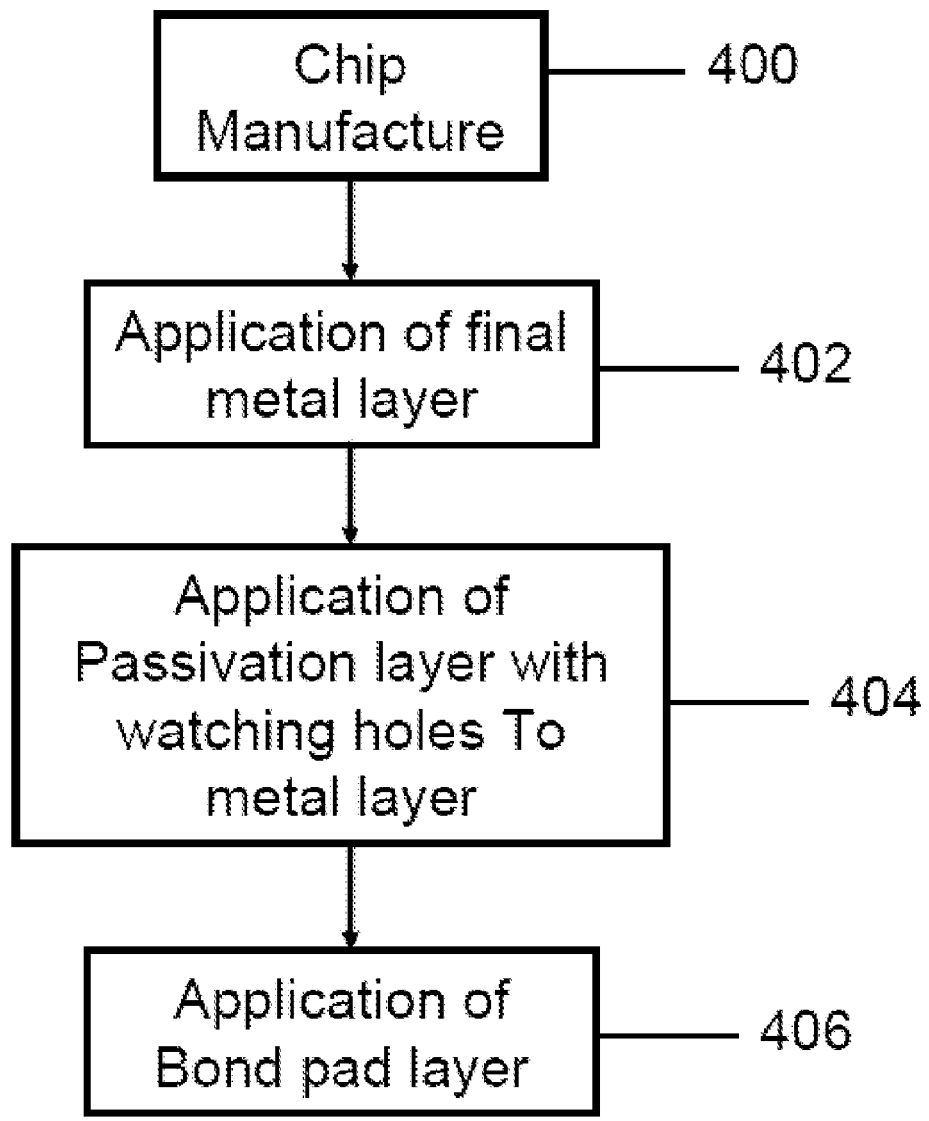
FIG. 4 is a flow chart showing method steps in accordance with one embodiment of the present invention.

The steps of manufacturing any chip which includes an anchor such as that described above will now be described with reference to FIG. 4. The chip is manufactured in the normal way, depending on the chip design and requirements (Step 400). The uppermost or top metal layer of the chip is applied (Step 402). This step can be carried out by any appropriate process. The uppermost metal layer includes a number of holes (which are sometimes called donuts) over the surface thereof. The passivation layer is then formed such that the holes are preserved in any area where bond pad anchoring is required (Step 404). The bond pad layer or regions are then applied (step 406). The passivation and bond pad may be fabricated by any appropriate processing method.

It will be appreciated that variations of the present invention are possible in respect of the elements and examples presented therein and that these variations are hereby included herein.

The invention claimed is:

1. A method of securing a bond pad to a semiconductor chip having an upper metal layer which includes one or more holes, the method comprising the steps of:
    forming a passivation layer over the upper metal layer, wherein the passivation layer has one or more holes therein, that overlies one or more holes in the upper metal layer and are substantially the same size or smaller than the one or more holes in the upper metal layer;
    forming the bond pad over the passivation layer;
    wherein forming the bond pad comprises introducing some of the material from the bond pad into the one or more holes in the passivation layer and upper metal layer when forming the bond pad, and allowing portions of the material of the bond pad to flow under the surface of the passivation layer and attach thereto without attaching to the upper metal layer to secure the bond pad to the passivation layer.

2. The method of claim 1 wherein the step of introducing the material comprises applying molten material onto the passivation layer such that molten material enters the one or more holes and flows along the underside of the passivation layer.

3. The method of claim 2, wherein the step of forming the passivation layer comprises forming the passivation layer having the one or more holes which are smaller than the one or more holes in the metal layer.

4. The method of claim 2, further comprising forming the one or more holes to be substantially rectilinear.

5. The method of claim 2, further comprising forming the one or more holes to be substantially circular.

6. The method of claim 1, wherein the step of forming the passivation layer comprises forming the passivation layer having holes which are smaller than the one or more holes in the metal layer.

7. The method of claim 1, further comprising forming the one or more holes to be substantially rectilinear.

8. The method of claim 1, further comprising forming the one or more holes to be substantially circular.

9. The method of claim 1, wherein the step of forming the passivation layer comprises forming the passivation layer having the one or more holes which are smaller than the one or more holes in the metal layer.

10. The method of claim 1, further comprising forming the one or more holes to be substantially rectilinear.

11. The method of claim 1, further comprising forming the one or more holes to be substantially circular.

12. A semiconductor chip having an upper metal layer which includes one or more holes, the chip further comprising:
- a passivation layer over the upper metal layer, wherein the passivation layer has one or more holes therein that overlies one or more holes of the upper metal layer and substantially the same size or smaller than the one or more holes of the upper metal layer; and
- a bond pad formed over the passivation layer;
- wherein the bond pad comprises a material that extends through the one or more holes in the passivation layer and upper metal layer wherein portions of the material extend along an underside of the passivation layer without attaching to the upper metal layer to secure the bond pad to the passivation layer.

13. The semiconductor chip of claim 12, wherein the one or more holes in the passivation layer are smaller than the one or more holes in the upper metal layer.

14. The semiconductor chip of claim 13, wherein the one or more holes is substantially rectilinear.

15. The semiconductor chip of claim 13, wherein the one or more holes is substantially circular.

16. The semiconductor chip of claim 12, wherein the one or more holes is substantially rectilinear.

17. The semiconductor chip of claim 12, wherein the one or more holes is substantially circular.

18. The semiconductor chip of claim 12, wherein the material is a molten material which enters the one or more holes and flows along the underside of the passivation layer.

* * * * *